United States Patent
Zhang

(10) Patent No.: US 7,617,435 B2
(45) Date of Patent: Nov. 10, 2009

(54) HARD-DECISION ITERATION DECODING BASED ON AN ERROR-CORRECTING CODE WITH A LOW UNDETECTABLE ERROR PROBABILITY

(76) Inventor: Yuwei Zhang, 3327 Hartwell Ct., Pleasanton, CA (US) 94588

( * ) Notice: Subject to any disclaimer, the term of this patent is extended or adjusted under 35 U.S.C. 154(b) by 509 days.

(21) Appl. No.: 11/380,820

(22) Filed: Apr. 28, 2006

(65) Prior Publication Data

US 2007/0198888 A1      Aug. 23, 2007

Related U.S. Application Data

(60) Provisional application No. 60/776,527, filed on Feb. 23, 2006.

(51) Int. Cl.
*H03M 13/00* (2006.01)

(52) U.S. Cl. ............... 714/756; 714/784; 714/792
(58) Field of Classification Search ............... 714/756, 714/784, 790, 792, 795, 799, 752, 48, 52; 375/265, 261
See application file for complete search history.

(56) References Cited

U.S. PATENT DOCUMENTS

| | | | | |
|---|---|---|---|---|
| 4,710,960 A | * | 12/1987 | Sato | 704/219 |
| 5,321,725 A | * | 6/1994 | Paik et al. | 375/265 |
| 5,659,578 A | * | 8/1997 | Alamouti et al. | 375/261 |
| 5,838,728 A | * | 11/1998 | Alamouti et al. | 375/265 |
| 6,034,996 A | * | 3/2000 | Herzberg | 375/265 |
| 6,634,007 B1 | * | 10/2003 | Koetter et al. | 714/784 |
| 7,000,174 B2 | * | 2/2006 | Mantha et al. | 714/790 |

* cited by examiner

*Primary Examiner*—Scott T Baderman
*Assistant Examiner*—Fritz Alphonse
(74) *Attorney, Agent, or Firm*—Christensen O'Connor Johnson Kindness PLLC

(57) ABSTRACT

A decoding system decodes forward error correction (FEC) encoded data. Factor graph circuitry (such as trellis decoder circuitry) processes the FEC encoded data according to at least one factor graph. Order restoring circuitry (such as convolutional deinterleaver circuitry) is coupled to an output of the factor graph circuitry and restores ordering of symbols in the encoded data. Error detection and correction circuitry is coupled to an output of the order restoring circuitry and processes block-based error correcting codes to detect and correct errors in the FEC encoded data and to provide a hard-decision output to an output of the decoding system. Feedback circuitry (such as convolutional interleaver circuitry and symbol interleaver circuitry) is coupled to process the hard-decision output from the error correction and detection circuitry and to provide the processed hard-decision output to the factor graph circuitry.

15 Claims, 3 Drawing Sheets

US 7,617,435 B2

HARD-DECISION ITERATION DECODING BASED ON AN ERROR-CORRECTING CODE WITH A LOW UNDETECTABLE ERROR PROBABILITY

CROSS REFERENCE TO RELATED APPLICATIONS

This application claims priority under 35 USC §119(e) from provisional application No. 60/776,527, filed Feb. 23, 2006, which is incorporated herein by reference for all purposes.

TECHNICAL FIELD

The invention relates to digital image processing and, more particularly, to decoding processing particularly suited to decode signals that have been encoded using a forward error correction and detection scheme having a very low undetectable error probability (such as the shortened Reed-Solomon encoding employed according to Advanced Television Systems Committee Standards). The decoding employs an iterative technique that includes hard decision error detection and correction decoding.

BACKGROUND

The Advanced Television Systems Committee (ATSC) publishes standards for encoding digital television (DTV) signals. For example, Section 5.1 of ATSC A/53E "Digital Television Standard," Annex D, dated 27 Dec. 2005, describes an encoding process in which:

Incoming data is randomized and then processed for forward error correction (FEC) in the form of Reed-Solomon (RS) coding (20 RS parity bytes are added to each MPEG-2 packet), one-sixth data field interleaving and two-thirds rate trellis coding.

FIG. 3 illustrates a conventional ATSC transmitted side encoder structure 300. As shown in FIG. 3, MPEP data 302 to be transmitted enters the encoder structure 300 and is randomized by randomizer circuitry 304. Reed-Solomon encoder circuitry 306 generates Reed-Solomon error correction codes, and the thus-encoded transmission data is provided to convolutional interleaver circuitry 308. The output of the convolutional interleaver circuitry 308 is provided to trellis encoder circuitry 310, the output of which is then provided 312 to the transmission channel.

FIG. 4 is a block diagram illustrating a conventional trellis encoder structure, as a component of the FIG. 3 ATSC transmitted-side encoder structure. The 8 VSB transmission subsystem employs a 2/3 rate (R=2/3) trellis code (with one unencoded bit which is precoded by a precoder 402). That is, one input bit (X1) is encoded into two output bits (Z1 and Z0) using a 1/2 rate convolutional code while the other input bit (X2) is precoded. A 4-state trellis encoder 404 is used. The output of the trellis encoder (Z2, Z1 and Z0) is provided to a symbol mapper 406, which is output to the channel (312, in FIG. 3).

It is desired to accurately and efficiently decode such encoded data.

SUMMARY

A decoding system is configured to decode forward error correction (FEC) encoded data. Factor graph circuitry (such as trellis decoder circuitry) is configured to process the FEC encoded data according to at least one factor graph. Order restoring circuitry (such as convolutional deinterleaver circuitry) is coupled to an output of the factor graph circuitry and is configured to restore ordering of symbols in the encoded data. Error detection and correction circuitry is coupled to an output of the order restoring circuitry and is configured to process block-based error correcting codes to detect and correct errors in the FEC encoded data and to provide a hard-decision output to an output of the decoding system. Feedback circuitry (such as convolutional interleaver circuitry and symbol interleaver circuitry) is coupled to process the hard-decision output from the error correction and detection circuitry and to provide the processed hard-decision output to the factor graph circuitry.

DETAILED DESCRIPTION

As discussed in the background, the forward error correction (FEC) scheme described in the ATSC A/53E specification is a concatenated Reed-Solomon (RS) code and trellis code scheme. Communication of such an encoded signal is typically characterized as being 3-4 dB away from the Shannon limit. That is, it is known to be theoretically possible to improve the error detection and correction performance associated with the transmission and decoding of such ASTC-encoded signals.

Turbo decoding is a conventional iterative technique to, at least in some situations, improve decoding system (including error detection and correction) performance. Turbo decoding with a soft-decision based iterative decoding algorithm can make the decoding system operate very close to the Shannon limit. However, the soft decision decoding of RS codes is, generally, an "NP problem." The present inventor has realized that the complexity otherwise associated with processing a trellis decoder soft output and a soft decision RS decoder output can be minimized. Broadly speaking, in accordance with an aspect, a hard-decision RS-based iterative decoding scheme is employed.

According to a hard-decision decoding scheme, the receiver makes a hard decision as to the identity of each transmitted symbol and, then, the sequence of received symbols are decoded to determine a corrected sequence of the transmitted symbols. On the other hand, according to a soft-decision decoding, the receiver makes an estimation of reliability of each possible decision before making "hard" decisions about each transmitted symbol at all. Then, a sequence of estimated reliabilities (soft decisions) is decoded to determine a corrected sequence of the transmitted symbols.

Figure 1:
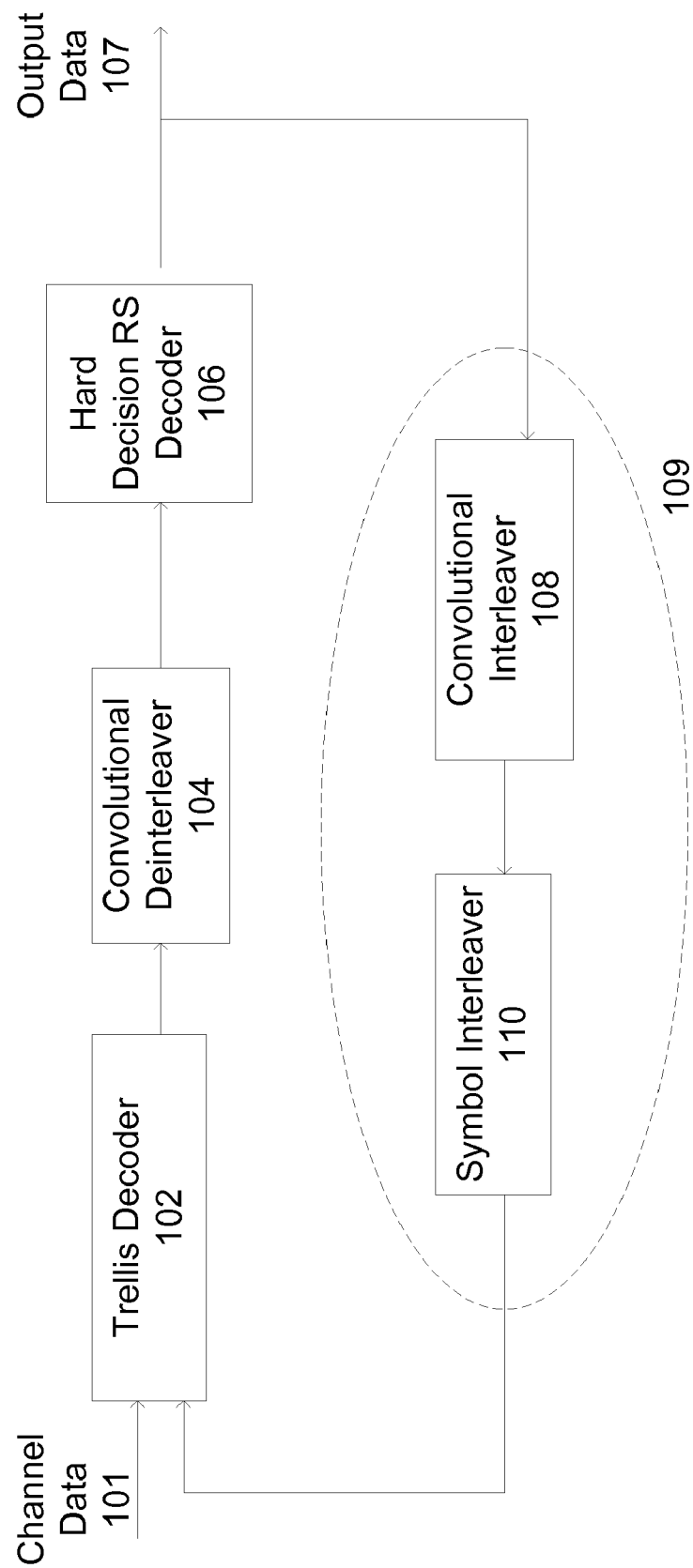
FIG. 1 is a block diagram of an iterative decoder system 100 in which a hard-decision error detection and correction decoder (in this case, a Reed Solomon-based decoder) is employed.

FIG. 1 illustrates an iterative decoder structure 100 according to an aspect, wherein a hard-decision RS-based iterative decoding scheme is employed. This is unlike conventional iterative decoder structures in which a soft-decision (as opposed to hard-decision iterative decoding scheme is employed.

Referring to FIG. 1, channel data 101 is provided to hard-decision-output trellis decoder circuitry 102. Decoding using other factor graphs (of which a trellis graph is an example) may also be employed for maximum likelihood decoding. The hard-decision output of the trellis decoder circuitry 102 is provided to the convolutional deinterleaver circuitry 104, which decodes the convolutionally-encoded source data output from the trellis decoder circuitry 102, as7 well as removing data interleaving. The convolutional deinterleaver circuitry 104 may include, for example, Viterbi decoder circuitry.

An input of an RS decoder 106 is coupled to the output of the convoltional deinterleaver circuitry 104. As mentioned above, the RS decoder 106 is a hard-decision decoder. As discussed above, in general, soft-decision decoding of RS code is an "NP problem." The inventor realized that the RS code in a signal encoded according to an ATSC-compliant FEC scheme is short enough—(207,187)—such that the RS code has very low undetectable error probability. As a result, an iterative decoding algorithm can be used in conjunction with hard-decision RS decoding.

In one example, the RS hard decision decoding is carried out using a known technique. There are many different algorithms for RS hard decision decoding. Among those algorithms, Berlekamp-Massey (BM) and Euclidean algorithm are popular. The RS decoding in one example has four steps, including Syndrome calculation (step 1); Key equation (step 2, using a BM or Euclidean algorithm); Chien search (step 3); and Error correction (step 4, using a Forney formula). The inventor has realized that, for the hard decision iteration scheme to improve decoding of FEC-encoded signals, the RS code should have a large enough Hamming distance or short enough message elements, which will result in the RS code having a very low undetectable error probability. The inventor has further realized that the RS code of ATSC meets this condition, and simulation indicates that at least a 1 dB improvement can be realized.

Turning back to FIG. 1, the output of the hard-decision RS decoder 106 is the decoded output data 107. In addition, the output of the hard-decision RS decoder 106 is also provided to circuitry 109 to be used, for example, by the trellis decoder 102 to guide subsequent decoding operations. In the FIG. 1 decoder structure 100, the circuitry 109 includes convolutional interleaver circuitry 108 and symbol interleaver circuitry 110.

Figure 2:
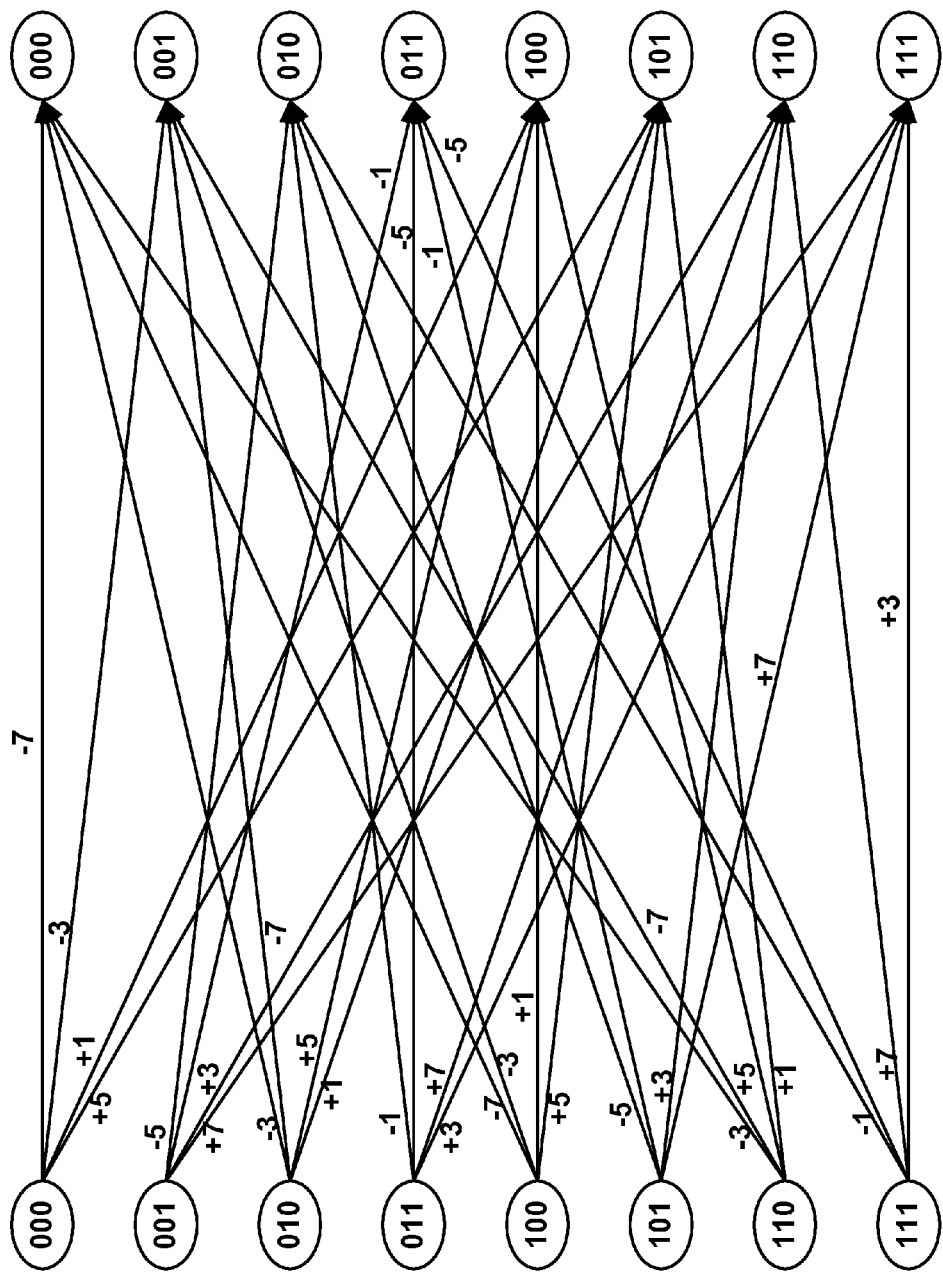
FIG. 2 illustrates an example of a factor graph-based decoder (specifically, an example of a trellis decoder such as the trellis decoder 102 in the FIG. 1 block diagram) operating according to a hard-decision based feedback input.
Figure 3:
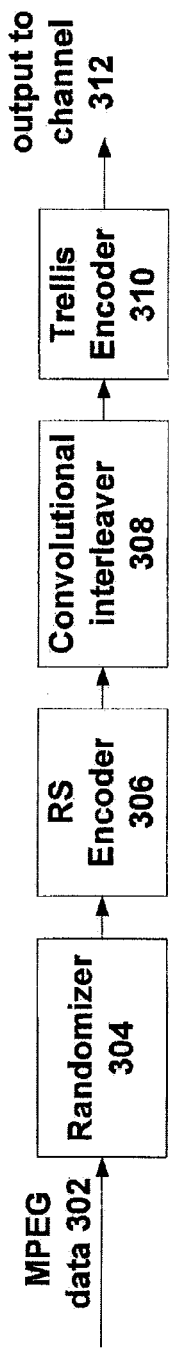
FIG. 3 is a block diagram illustrating a conventional ATSC transmitter-side encoder structure.
Figure 4:
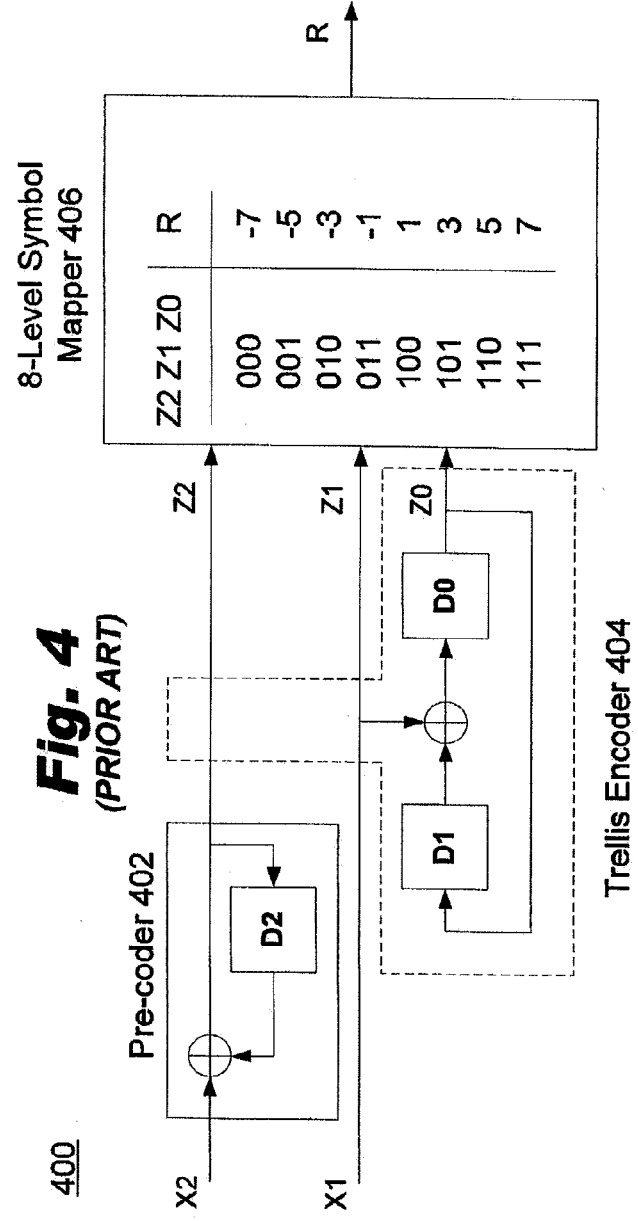
FIG. 4 is a block diagram illustrating a conventional trellis encoder structure, as a component of the FIG. 3 ATSC transmitted-side encoder structure.

We now discuss the trellis decoder circuitry 102 in greater detail and, specifically, how the trellis decoder circuitry 102 uses the hard decision output of the hard decision RS decoder 106. In general, factor graph decoding is based on an algorithm to determine a best path through a factor graph. For example, as shown in FIG. 2, trellis decoding is based on a Viterbi algorithm. For decoding ATSC-compliant FEC-encoded signals, an eight state trellis diagram can be utilized (as shown in the FIG. 2 example) for trellis decoding. Still using the FIG. 2 example, it can be see that each state has four branches to merge in from the four previous states. Using the Viterbi algorithm, a best branch is chosen from the four possible branches based on state metrics criterion (which is a kind of measurement for the distance between the received data sequence and the candidate decoded data sequence). For each state, the chosen best branch connects together with the previous best branches to form a best path. So at any given time, the eight trellis states associate with eight candidate decoding sequences. The Viterbi algorithm results in the choice of a best candidate decoding sequence as the final decoded sequence, based on the state metrics value.

When hard decision information is available from the RS decoder circuitry 106, the trellis decoder 102 takes the branch indicated by the RS data directly from the four possible branches. Otherwise, if the RS decoder circuitry 106 indicates the feedback data is not reliable (or the feedback data is otherwise deemed to be not reliable or not to be relied upon), the trellis decoder circuitry 106 searches for the best branch as just discussed.

A system and methodology has been described for hard-decision RS-based iterative decoding of ATSC-encoded signals. As discussed, the system and methodology is generally applicable to the use of Reed-Solomon (and other error correction and detection) decoding schemes in an iterative manner where the output of the error correction and detection circuitry has a very low undetectable error probability.

What is claimed is:

1. A decoding system, configured to decode forward error correction (FEC) encoded data that has been encoded using a concatenated Reed-Solomon code and trellis code scheme, comprising:

trellis decoder circuitry configured to process the encoded data according to path portions of at least one trellis graph;

order restoring circuitry coupled to an output of the trellis decoder circuitry configured to restore ordering of symbols in the encoded data;

Reed-Solomon error detection and correction circuitry coupled to an output of the order restoring circuitry, configured to process block-based error correcting codes in data from the trellis decoder circuitry to detect and correct errors in the FEC encoded data, and further configured to provide a hard-decision output as an output of the decoding system; and reordering circuitry coupled to an output of the Reed-Solomon error detection and correction circuitry and configured to reorder the hard-decision output and to provide the reordered hard-decision output to the trellis decoder circuitry;

wherein the trellis decoder circuitry is configured to choose one or more path portions of the at least one trellis graph indicated by the hard-decision output from the Reed-Solomon error detection and correction circuitry, and wherein an output of the trellis decoder circuitry depends, at least in part, on the chosen one or more path portions.

2. The decoding system of claim 1, wherein the reordering circuitry is configured to reorder the hard-decision output by convolving and interleaving the hard-decision output from the Reed-Solomon error detection and correction circuitry.

3. A decoding system, configured to decode forward error correction (FEC) encoded data, comprising:

factor graph decoding circuitry configured to process the encoded data according to particular path portions of at least one factor graph;

order restoring circuitry coupled to an output of the factor graph decoding circuitry and configured to restore ordering of symbols in the encoded data;

error detection and correction circuitry coupled to an output of the order restoring circuitry, configured to process block-based error correcting codes to detect and correct errors in the encoded data, and further configured to provide a hard-decision output as an output of the decoding system; and feedback circuitry configured to process the hard-decision output and to provide the processed hard-decision output to the factor graph decoding circuitry;

wherein the factor graph decoding circuitry is configured to choose particular path portions of the at least one factor graph based on the processed hard-decision output and to process the encoded data according to the chosen particular path portions.

4. The decoding system of claim 3, wherein the factor graph decoding circuitry includes trellis decoder circuitry configured to process the encoded data according to at least one trellis graph.

5. The decoding system of claim 4, wherein the feedback circuitry includes circuitry configured to convolve and interleave the hard-decision output and to provide the convolved interleaved hard-decision output to the trellis decoder circuitry.

6. The decoding system of claim 3, wherein the feedback circuitry includes circuitry configured to convolve and interleave the hard-decision output and to provide the convolved interleaved hard-decision output to the factor decoding circuitry.

7. The decoding system of claim 3, wherein the error detection and correction circuitry includes Reed-Solomon decoding circuitry.

8. The decoding system of claim 3, wherein:

the factor graph decoding circuitry includes a plurality of path portions, wherein the path portions comprise one or more paths corresponding to possible decoding output of the factor graph circuitry; and the factor graph decoding circuitry is further configured to operate such that the output of the factor graph circuitry is based on the one or more path portions indicated by the processed hard-decision output.

9. The decoding system of claim 8, wherein the factor graph decoding circuitry is further configured to operate such that when the hard-decision output is not provided, the one or more path portions on which the output of the factor graph decoding circuitry is based is determined based on state metrics criteria.

10. A method of decoding encoded data with a decoder, wherein the data has been encoded using forward error correction (FEC) encoding, the method comprising:

(a) processing the encoded data according to at least one factor graph;

(b) processing block-based error correcting codes in a result of step (a) to detect and correct errors in the FEC encoded data and providing a hard-decision output based thereon; and (c) feeding back the hard-decision output from step (b) to provide the processed hard-decision output to subsequent instances of step (a);

wherein the subsequent instances of step (a) include determining particular path portions of the at least one factor graph based, at least in parts, on the provided processed hard-decision output and processing the encoded data according to the determined particular path portions.

11. The method of claim 10, wherein said processing the encoded data includes processing the encoded data according to at least one trellis graph.

12. The method of claim 11, wherein said feeding back the hard-decision output from step (b) includes convolving and interleaving the hard decision output from step (b).

13. The method of claim 10, wherein said feeding back the hard-decision output from step (b) includes convolving and interleaving the hard decision output from step (b).

14. The method of claim 10, wherein step (b) includes processing the block-based error correcting codes according to Reed-Solomon decoding.

15. The method of claim 10, wherein step (a) further includes processing the factor graph such that when the hard-decision output is not provided from step (b), the particular path portions are determined based on state metrics criteria.

* * * * *

UNITED STATES PATENT AND TRADEMARK OFFICE
CERTIFICATE OF CORRECTION

PATENT NO.       : 7,617,435 B2                                        Page 1 of 1
APPLICATION NO. : 11/380820
DATED            : November 10, 2009
INVENTOR(S)      : Yuwei Zhang It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 705 days.

Signed and Sealed this

Fourteenth Day of December, 2010

David J. Kappos
*Director of the United States Patent and Trademark Office*